(12) United States Patent
Isbara

(10) Patent No.: US 6,882,209 B1
(45) Date of Patent: *Apr. 19, 2005

(54) METHOD AND APPARATUS FOR INTERFACING MIXED VOLTAGE SIGNALS

(75) Inventor: Melik Isbara, Sunnyvale, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1048 days.

(21) Appl. No.: 08/925,868

(22) Filed: Sep. 9, 1997

(51) Int. Cl.[7] ............................................. H03K 17/16
(52) U.S. Cl. ...................... 327/390; 327/333; 327/589
(58) Field of Search ............................... 327/308, 333, 327/390, 536, 589, 108–112, 374–377, 427, 434; 333/81 R

(56) References Cited

U.S. PATENT DOCUMENTS

| | | | | |
|---|---|---|---|---|
| 3,579,023 A | * | 5/1971 | Fox ............................. 315/18 |
| 4,023,050 A | * | 5/1977 | Fox et al. ..................... 326/70 |
| 4,119,870 A | * | 10/1978 | Zibert ........................ 327/208 |
| 4,507,618 A | * | 3/1985 | Nelson ..................... 333/81 R |
| 4,636,907 A | * | 1/1987 | Howell ....................... 307/137 |
| 4,688,267 A | * | 8/1987 | Chown et al. .............. 455/619 |
| 4,970,478 A | * | 11/1990 | Townley ................... 333/81 R |
| 5,012,123 A | * | 4/1991 | Ayasli et al. ................ 327/427 |
| 5,084,637 A | * | 1/1992 | Gregor ......................... 326/81 |
| 5,130,571 A | * | 7/1992 | Carroll ....................... 327/365 |
| 5,604,364 A | * | 2/1997 | Ohmi et al. ................. 257/291 |
| 6,111,422 A | * | 8/2000 | Storino et al. .............. 324/763 |
| 6,111,434 A | * | 8/2000 | Ciraula et al. ................ 326/28 |
| 6,690,222 B1 | * | 2/2004 | Nair ........................... 327/205 |

FOREIGN PATENT DOCUMENTS

GB          1287021       *  8/1972   ................. 327/308

OTHER PUBLICATIONS

David Greenhill, et al., "FA 10.2: A 330MHz 4-Way Superscalar Microprocessor", Digest of Technical Papers, ISSCC97/Feb. 1997 IEEE International Solid-State Circuits Conference, Sun Microsystems Inc., Mountain View, CA (pp. 166–167).

* cited by examiner

*Primary Examiner*—Kenneth B. Wells
(74) *Attorney, Agent, or Firm*—Blakely, Sokoloff, Taylor & Zafman LLP

(57) ABSTRACT

A buffer circuit is used to convert signals of a first preselected voltage level to a second preselected voltage level. A pass gate transistor has a gate, source, and drain and is adapted to receive the signals of the first preselected voltage level, and deliver the signals of the second preselected voltage level. A capacitor is coupled across the source and drain of the pass gate transistor. A resistive element is coupled between the gate of the pass gate transistor and a voltage supply. The resistive element cooperates with a parasitic capacitance located between the gate and source of the pass gate transistor to form a pump that reacts to a low-to-high transition in the input signal to temporarily increase the voltage level applied to the gate of the pass gate transistor. This temporarily increased voltage level causes the voltage level output from the pass gate transition to track the transition in the input signal more closely.

19 Claims, 2 Drawing Sheets

METHOD AND APPARATUS FOR INTERFACING MIXED VOLTAGE SIGNALS

BACKGROUND OF THE INVENTION

1. Field of the Invention

This invention relates generally to interfacing electrical components, and, more particularly, to a method and apparatus for interfacing electrical components operating at different voltage levels.

2. Description of the Related Art

Over time, manufacturers of integrated circuits have been able to place more and more circuitry on less and less real estate of a semiconductor chip. The ability to place more circuitry on an integrated circuit chip is a function of at least the size of the components constructed on the chip and the spacing between components (i.e., density). Reductions in size and spacing have allowed the use of lower voltage levels to properly operate an integrated circuit.

Operating integrated circuit chips at reduced voltages has inherent advantages. For example, lowered operating voltages allow even densely packed integrated circuit chips to operate at relatively low temperatures, such that exotic cooling methods are not required. Moreover, using lower voltages reduces power consumed by an integrated circuit chip, which is of particular significance in battery-operated devices, such as portable computers.

A disadvantage of operating an integrated circuit chip at a reduced voltage is that an integrated circuit chip is commonly required to interface with a variety of existing integrated circuit chips that operate at a higher voltage level. Thus, when a reduced voltage integrated circuit chip is used as part of a larger system, it will likely be required to receive interface signals at these higher voltage levels. Often, these interface signals are digital in form, and must be able to transition between their logically high and low states within a relatively short, preselected period of time. Heretofore, signal conditioning circuitry used to translate from these higher voltage levels to the lower voltage levels has adversely affected the transition time period, and thereby reduced the performance of lower voltage integrated circuit chips. A slower transition time means that a receiving circuit must wait longer to ensure that the signal has stabilized before the signal can be accessed. Thus, slower transition times translate to slower overall operating speed.

The present invention is directed to overcoming, or at least reducing the effects of, one or more of the problems set forth above.

SUMMARY OF THE INVENTION

In one aspect of the present invention, an apparatus is provided for converting signals of a first preselected voltage level to a second preselected voltage level. A pass gate transistor has a gate, source, and drain and is adapted to receive the signals of the first preselected voltage level, and deliver the signals of the second preselected voltage level. A capacitor is coupled across said source and drain of the pass gate transistor. A resistive element is coupled between the gate of the pass gate transistor and a voltage supply.

In another aspect of the instant invention, a method is provided for converting an input signal of a first preselected voltage level to a second preselected voltage level. The method includes charging a gate of a pass gate transistor to a third preselected voltage level to enable the pass gate transistor to pass at least a portion of the voltage level of the input signal to an output node; charging the gate of the pass gate transistor to a fourth preselected level for a preselected period of time during a transition in the input signal from a logically low voltage level to a logically high voltage level, said fourth preselected level being greater than said third preselected level; and passing at least a portion of any AC component in said input signal to the output node.

BRIEF DESCRIPTION OF THE DRAWINGS

Other objects and advantages of the invention will become apparent upon reading the following detailed description and upon reference to the drawings in which.

Figure 1:
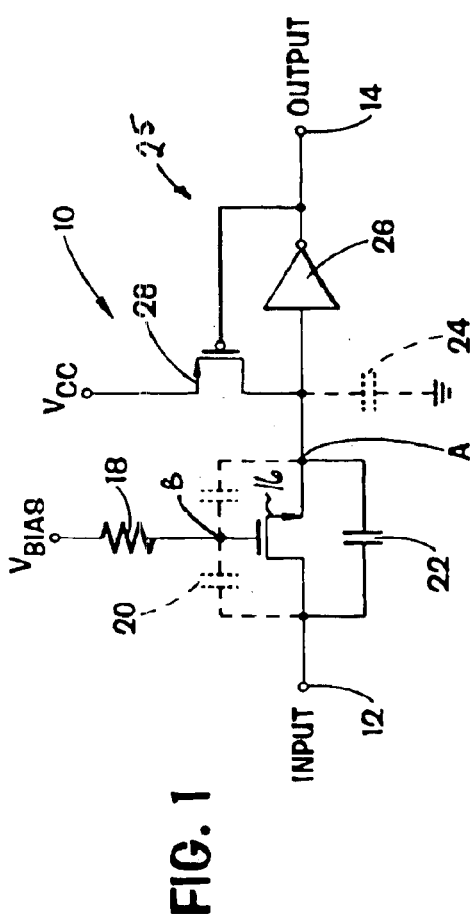
FIG. 1 is a block diagram of one embodiment of an interface circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1, a block diagram of a buffer circuit 10 useful in interfacing a higher voltage input terminal 12 to a lower voltage output terminal 14 is shown. A signal on the input terminal 12 is digital in nature and can vary, for example, between about 0 and 2.5 volts. The signal on the output terminal 14 is also digital in nature and can vary, for example, between the values of about 0 and 1.8 volts. A pass gate transistor 16 has its drain coupled to the input terminal 12 and its source coupled to a node A. The gate of the pass gate transistor 16 is coupled through a node B and a resistive element (such as an active resistor) 18 to a voltage source $V_{bias}$, which can have a value, for example, of about 1.8 volts. The voltage $V_{bias}$, operates to continuously turn the transistor 16 "on," passing at least a portion of the voltage present on the input terminal 12 to the node A. The resistor 18 enhances the transition time of the signal appearing at node A while providing electrostatic discharge protection. This enhanced transition time is accomplished through a pumping action of a parasitic capacitor 20 located between the drain and gate of the pass gate transistor 16. Generally, the presence of the resistor 18 and parasitic capacitor 20 operate to temporarily increase the voltage applied to the gate of the pass gate transistor 16 during a low-to-high transition at the input terminal 12. A detailed description of this pumping action is described below in conjunction with the circuit diagram of FIG. 2 and the wave forms of FIG. 3B.

An alternating current (AC) bypass capacitor 22 is coupled between the source and drain of the pass gate transistor 16 to further enhance the transition time of the voltage appearing at the node A in response to a corresponding transition in a signal applied to the input terminal 12. In particular, the AC bypass capacitor 22 enhances the switching speed of a low-to-high transition while not negatively impacting the switching speed in a high-to-low transition equally. The AC bypass capacitor 22 works in cooperation with a parasitic capacitor 24 located between the node A and system ground. Generally, the capacitor 22 operates to speed up the rising edge of a low-to-high transition at the node A by providing an additional AC path from the input terminal 12 to the node A. An analysis of the operation of the capacitors 22, 24 is provided below in conjunction with the schematic diagram of FIG. 2 and the wave forms of FIG. 3B.

The node A is coupled through a buffer circuit 25 to the output terminal 14. The buffer circuit 25 can take on a variety of forms, but in the illustrated embodiment is an inverter 26 operating from a supply voltage $V_{cc}$. The supply voltage $V_{cc}$ is selected to have a reduced value, as compared to the voltage level of signals received at the input terminal 12. Thus, the signal at the output terminal 14 is digital in nature, but has a reduced maximum voltage compared to that of the signal at the input terminal 12, and is the digital complement of the signal applied to the input terminal 12.

A PMOS-type transistor 28 has its gate coupled to the output terminal 14, its drain coupled to the node A and its source coupled to the supply voltage $V_{cc}$, which can have a value, for example, of about 1.8 volts. When the input signal applied to the inverter 26 is at a logically high level, the corresponding output of the inverter 26 is forced to a logically low level, biasing the transistor 28 "on." With the transistor 28 biased "on," the node A is clamped to $V_{cc}$, thereby ensuring that the already logically high input to the inverter 26 is pulled to a voltage level sufficiently above the switching point of the inverter 26 to prevent any leakage current therethrough.

Figure 2:
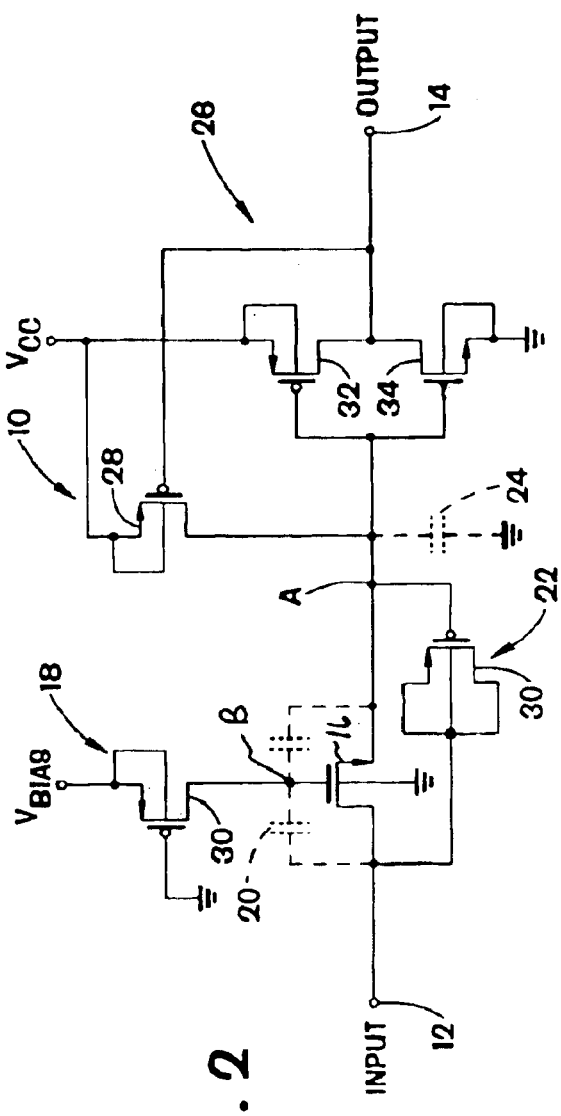
FIG. 2 is an electrical schematic of one embodiment of an interface circuit.

Turning now to FIG. 2, a more detailed schematic of one embodiment of the buffer circuit 10 described in FIG. 1 is shown. The pass gate transistor 16 is an NMOS-type transistor that has its substrate coupled to system ground. The resistor 18 is formed from a PMOS-type transistor 30 that has its gate coupled to system ground, its drain coupled through the node B to the gate of the pass gate transistor 16, and its substrate and source coupled to the voltage $V_{bias}$. The AC bypass capacitor 22 is implemented using a PMOS-type transistor with its gate coupled to the node A and its source, drain, and substrate coupled to the input terminal 12.

The inverter 26 is constructed from a pair of transistors 32, 34 serially coupled together between the voltage $V_{cc}$ and system ground. The transistor 32 is a PMOS-type transistor having its gate coupled to the node A, its source and substrate coupled to the voltage $V_{cc}$, and its drain coupled to the output terminal 14. The transistor 34 is a NMOS-type transistor having its gate coupled to the node A, its drain coupled to the output terminal 14, and its source and substrate coupled to system ground.

The transistor 28 is a PMOS-type transistor having its drain coupled to the node A, its gate coupled to the output terminal 14, and its source and substrate coupled to the voltage $V_{cc}$. Thus, when a logically high signal (e.g., about 2.5 volts in this embodiment) is present at the input terminal 12, the node A will charge toward a voltage level of about $V_{bias}-V_{tn}$, where $V_{tn}$ is the threshold voltage of the pass gate transistor 16. The presence of the voltage $V_{bias}-V_{tn}$ at the node A is sufficient to bias the transistor 34 "on" and the transistor 32 "off." With the transistor 34 biased "on," the output terminal 14 is pulled down to system ground through the transistor 34, producing a logically low output signal. The logically low signal on the output terminal 14 biases the transistor 28 "on," pulling the node A up to the voltage level $V_{cc}$. The presence of the voltage level $V_{cc}$ on the node A biases the transistor 34 "on" hard and the transistor 32 "off" hard to prevent leakage current from flowing from the voltage $V_{cc}$ to system ground through the transistors 32, 34. Without the voltage level of the node A being pulled up by the transistor 28, then the voltage level $V_{bias}-V_{tn}$ could be low enough to bias both of the transistors 32, 34 partially "on," and allow a small amount of leakage current to flow through the transistors 32, 34.

Conversely, when a logically low signal (e.g., about 0 volts in this embodiment) is present at the input terminal 12, the node A will be forced to a voltage level of about 0 volts. The presence of about 0 volts at the node A is sufficient to bias the transistor 32 "on" and the transistor 34 "off." With the transistor 32 biased "on," the output terminal 14 is pulled up to about $V_{cc}$ through the transistor 32, producing a logically high output signal.

Figure 3A:
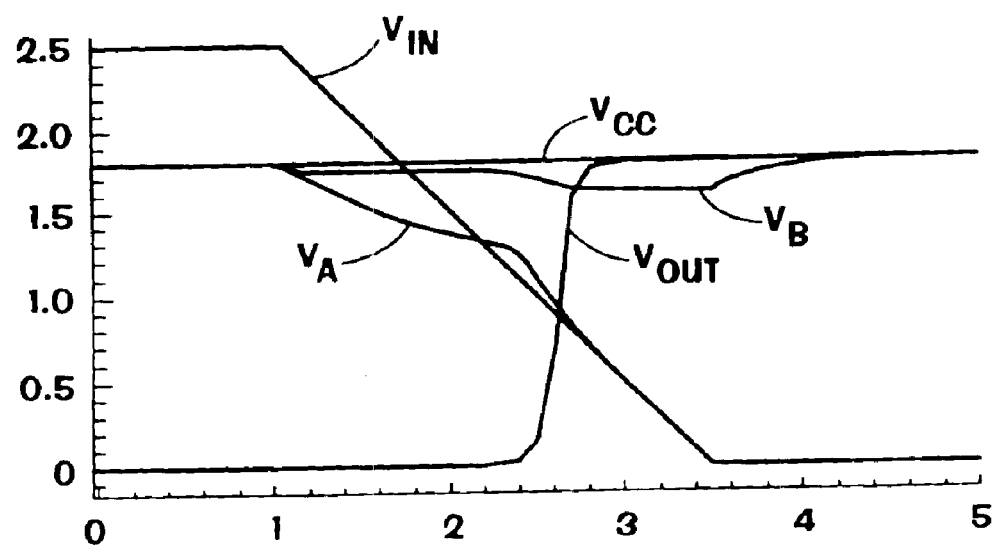
FIGS. 3A and B are wave form diagrams for various nodes of the schematic of FIG. 2.
Figure 3B:
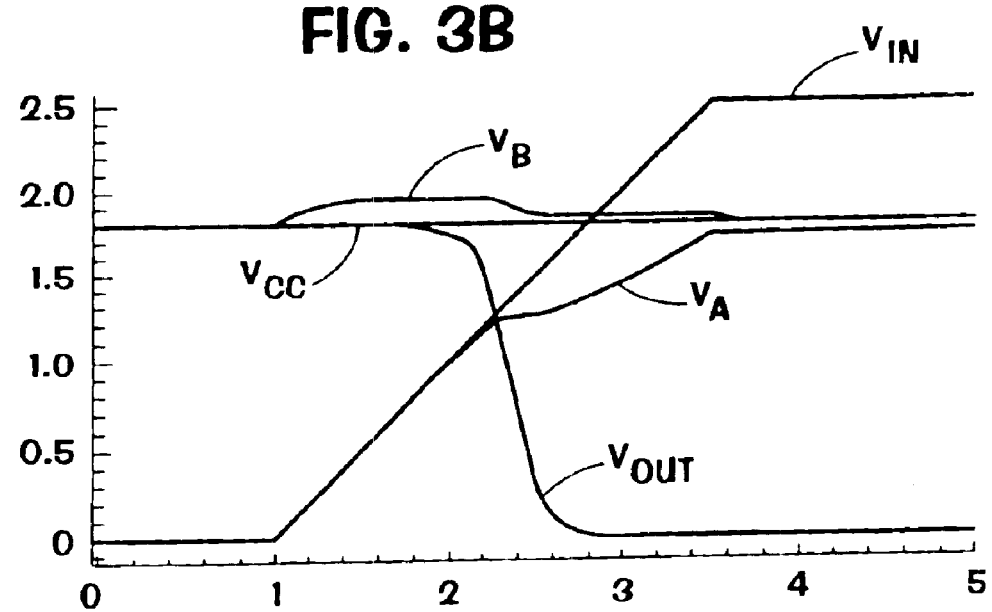

Referring now to FIGS. 2 and 3 jointly, the interaction of the pass gate transistor 16, the resistor 18, and the AC bypass capacitor 22 are discussed in greater detail. A voltage level $V_{IN}$ at the input terminal 12 varies between a logically high level and a logically low level of, for example, about 2.5 and 0 volts in this embodiment. A transition in the voltage level $V_{IN}$ from a logically low level to a logically high level is shown in FIG. 3B. The input terminal 12 is coupled to the node B via the parasitic capacitor 20. Thus, a change in the voltage level $V_{IN}$ from 0 to 2.5 volts results in the voltage at the node B, $V_B$ being pumped up to a voltage higher than $V_{bias}$. The voltage at the node B, $V_B$ is at about $V_{bias}$, prior to the transition from 0–2.5 volts in the voltage level $V_{IN}$. In this example, the voltage level $V_{bias}$ is about the same as the voltage level $V_{cc}$, although the invention is not restricted in scope in this respect. Since the voltage across the capacitor 20 cannot change instantaneously with the change in the voltage level $V_{IN}$, the voltage level $V_B$ is pumped up toward the voltage level $V_{bias}+\alpha V_{IN}$ (where $\alpha<1$). With the voltage level $V_B$ temporarily pumped up above $V_{bias}$, the pass gate transistor 16 is biased "on" harder, causing the voltage level $V_A$ at the node A to rise at a faster rate than would otherwise occur without the existence of the resistive element 18. At the same time, the AC bypass capacitor 22 also responds to the voltage level $V_{IN}$ by passing the AC component of the voltage level $V_{IN}$ to the node A. The AC component of the voltage level $V_{IN}$ also acts to accelerate the change in the voltage level $V_A$. The capacitors 22, 24 form a voltage divider network to control the voltage level applied to the node A by the AC component of $V_{IN}$.

The voltage level $V_A$ will continue to rise at its accelerated rate until it passes the level at which the transistor 34 is biased "on," and the transistor 32 is biased "off." At that time, as described above in conjunction with FIGS. 1 and 2, the output terminal 14 is coupled to system ground through the transistor 34, turning "on" the transistor 28 and pulling the node $V_A$ toward the voltage level $V_{cc}$. At about that time, the voltage level $V_B$ will begin to decay, thereby reducing the rate at which the voltage level $V_A$ approaches the voltage level $V_{cc}$. The resulting transition time for the voltage level $V_{OUT}$ at the output terminal 14 is relatively short.

A transition in the voltage level $V_{IN}$ from a logically high level to a logically low level is shown in FIG. 3A. Prior to a transition of the voltage level $V_{IN}$ from 2.5 volts to 0 volts, the voltage level $V_B$ is at about $V_{bias}$, or about 1.8 volts in this example. Thus, the voltage level $V_B$ is at about 0.7 volts below the voltage level $V_{IN}$. When the voltage level $V_{IN}$ changes toward 0 volts, the voltage level across the capacitor 20 cannot change instantaneously, but attempts to maintain the 0.7 volt differential between the voltage levels $V_{IN}$ and $V_B$, pulling the voltage level $V_B$ toward $-0.7$ $V_{bias}$ volts. With the voltage level $V_B$ temporarily pulled down below the voltage level $V_{bias}$, the pass gate transistor 16 remains biased "on," but not as hard as when the voltage level $V_B$ is at about the voltage level $V_{bias}$ or higher. This reduction in the voltage level $V_B$ has the effect of reducing the rate at which the voltage level $V_A$ is pulled towards 0 volts, increasing the transition time period for a high-to-low transition. The AC bypass capacitor 22 helps to reduce this affect by enabling the resistor value to be lower.

The voltage level $V_A$ will continue to fall at its compromised rate influenced by the reduced voltage level $V_B$ and the enhanced voltage level delivered through the capacitor 22 until it passes the level at which the transistor 32 is biased by "on," and the transistor 34 is biased "off." At that time, as described above in conjunction with FIGS. 1 and 2, the output terminal 14 is coupled to the voltage level $V_{cc}$ through the transistor 32, turning "off" the transistor 28 and disconnecting the voltage level $V_{cc}$ from the node A. Just before the output terminal 14 switches from its low to high state, the voltage level $V_B$ begins to rise toward the voltage level $V_{bias}$ as the capacitor 20 charges, thereby increasing the rate at which the voltage level $V_A$ approaches the voltage level of about 0 volts. The resulting transition time for the voltage level $V_{OUT}$ at the output terminal 14 is relatively short.

What is claimed is:

1. An apparatus, comprising:
    a transistor having an enable terminal, an input terminal, and an output terminal, said input terminal coupled to receive binary signals that vary between first and second preselected voltage levels, and said output terminal coupled to deliver binary signals that vary between the first preselected voltage level and a third preselected voltage level;
    a capacitor coupled across said input and output terminals of said transistor; and
    a resistive element having a first end portion coupled to the enable terminal of said transistor and a second end portion coupled to a voltage supply to bias the transistor continuously on, the resistive element cooperating with a parasitic capacitor defined by said transistor to increase the voltage applied to the enable terminal during a transition from the first to the second preselected voltage level at the input terminal.

2. An apparatus, as set forth in claim 1, including a buffer circuit having an input terminal coupled to receive said signals that vary between the first and third preselected voltage levels.

3. An apparatus, as set forth in claim 2, wherein said buffer circuit includes an inverter.

4. An apparatus, as set forth in claim 3, including a pull-up transistor coupled between the input of said inverter and a voltage supply, and having an enable terminal coupled to the output of said inverter.

5. An apparatus, as set forth in claim 4, wherein said pull-up transistor comprises a PMOS-type transistor.

6. An apparatus, as set forth in claim 1, wherein said resistive element comprises a resistor.

7. An apparatus, as set forth in claim 1, wherein said resistive element comprises an active transistor.

8. An apparatus for converting first digital signals that vary between a first and second preselected voltage levels to second digital signals that vary between the first and a third preselected voltage level, comprising:
    a pass gate transistor having a gate, source, and drain, said drain coupled to receive said first signals, said source coupled to deliver said second signals, said gate coupled to a voltage supply;
    a capacitor coupled across said source and drain of said pass gate transistor; and
    a pump coupled to the gate of said pass gate transistor, said pump being configured to increase the voltage level applied to said gate during a transition from the first to the second preselected voltage levels.

9. An apparatus, as set forth in claim 8, wherein said pump includes a resistive element coupled between the gate of said pass gate transistor and said voltage supply, and a capacitor coupled to the gate of said pass gate transistor to receive said first digital signals.

10. An apparatus, as set forth in claim 9, wherein said capacitor coupled to the gate of said pass gate transistor is a parasitic capacitor.

11. An apparatus, as set forth in claim 9, wherein said resistive element is a resistor.

12. An apparatus, as set forth in claim 9, wherein said resistive element is an active transistor.

13. An apparatus for converting an input signal that varies between first and second preselected voltage levels to an output signal that varies between the first preselected voltage level and a third preselected voltage level, comprising:
    a first circuit;
    a pass gate transistor having a gate, source, and drain, said drain coupled to receive said input signal, said source coupled to deliver said output signal, said gate being coupled to a voltage supply;

a capacitor coupled across said source and drain of said pass gate transistor; and means for increasing the voltage level applied to said gate during a transition of the input signal from the first to the second preselected voltage level.

14. An apparatus, as set forth in claim 13, wherein said means for increasing the voltage level applied to said gate for a preselected period of time.

15. A method for converting an input signal that varies from 0 volts to a first preselected voltage level to an output signal that varies from 0 volts to a second preselected voltage level, comprising:

charging a gate of a pass gate transistor to a third preselected voltage level to enable the pass gate transistor to pass at least a portion of the input signal to an output node;

charging the gate of the pass gate transistor to a fourth preselected voltage level for a preselected period of time, said fourth preselected voltage level being greater than said third preselected level; and passing at least a portion of any AC component in said input signal to said output node.

16. A method, as set forth in claim 15, wherein charging the gate of the pass gate transistor to a fourth preselected voltage level includes charging the gate of the pass gate transistor to a fourth preselected voltage level for a preselected period of time during a transition in said input signal from 0 volts to the first preselected voltage level.

17. A buffer circuit, comprising:

a pass gate transistor having a gate, source, and drain, said drain coupled to receive a first digital signal that varies between first and second voltage levels;

a first voltage supply coupled to the gate of said pass gate transistor to bias the transistor continuously on;

a capacitor coupled across the source and drain of said pass gate transistor;

an inverter having an input terminal and an output terminal, said input terminal coupled to the source of said pass gate transistor to receive a second digital signal that varies between the first voltage level and a third voltage level;

a pull-up transistor having a source coupled to a second voltage supply, a drain coupled to the source of said pass gate transistor, and a gate coupled to the output terminal of said inverter; and a resistive element coupled between said first voltage supply and the gate of said pass gate transistor, the resistive element cooperating with a parasitic capacitor defined by the drain and gate of said pass gate transistor to increase the applied voltage to the gate of said pass gate transistor.

18. The buffer circuit of claim 17, wherein the resistive element comprises a resistor.

19. The buffer circuit of claim 17, wherein the resistive element comprises a PMOS-type transistor having a gate coupled to ground, a drain coupled to the gate of the pass gate transistor, and a source coupled to the first voltage supply.

* * * * *